US011502692B2

(12) United States Patent
Xie et al.

(10) Patent No.: US 11,502,692 B2
(45) Date of Patent: Nov. 15, 2022

(54) SERVER DATA SENDING METHOD AND APPARATUS

(71) Applicant: ALIBABA GROUP HOLDING LIMITED, Grand Cayman (KY)

(72) Inventors: Jiushi Xie, Hangzhou (CN); Hua Wang, Hangzhou (CN); Guoyin Li, Hangzhou (CN); Jiang Deng, Hangzhou (CN); Dongjie Chen, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 46 days.

(21) Appl. No.: 17/120,808

(22) Filed: Dec. 14, 2020

(65) Prior Publication Data

US 2021/0099176 A1 Apr. 1, 2021

Related U.S. Application Data

(63) Continuation of application No. PCT/CN2019/089926, filed on Jun. 4, 2019.

(30) Foreign Application Priority Data

Jun. 13, 2018 (CN) .......................... 201810610156.X

(51) Int. Cl.
*H04B 17/00* (2015.01)
*H03L 1/02* (2006.01)
(Continued)

(52) U.S. Cl.
CPC ................ *H03L 1/028* (2013.01); *H03B 5/04* (2013.01); *H03L 1/026* (2013.01); *H04B 17/11* (2015.01);
(Continued)

(58) Field of Classification Search
CPC .......... H03L 1/028; H03L 1/026; H03B 5/04; H04B 17/11; H04B 7/2656; H04L 1/0007;
(Continued)

(56) References Cited

U.S. PATENT DOCUMENTS 6,894,975 B1 5/2005 Partyka
2001/0055319 A1* 12/2001 Quigley ................ H04L 1/0003
725/111

(Continued)

FOREIGN PATENT DOCUMENTS

CN 101883420 A 11/2010
WO WO 03/008013 A2 1/2003
WO WO 2019/237963 A1 12/2019

OTHER PUBLICATIONS

PCT International Search Report and Written Opinion dated Aug. 21, 2019, issued in corresponding International Application No. PCT/CN2019/089926 (8 pgs.).

*Primary Examiner* — Don N Vo
(74) *Attorney, Agent, or Firm* — Finnegan, Henderson, Farabow, Garrett & Dunner, LLP

(57) ABSTRACT

Embodiments of the present disclosure provide a server data sending method and a server data sending apparatus. The method can include: acquiring, by a server, crystal oscillator error information and operating rate information of a terminal; setting, by the server, preamble length information according to the crystal oscillator error information and the operating rate information; and sending, by the server, a downlink data frame to the terminal, the downlink data frame comprising a preamble aligned with the preamble length information.

20 Claims, 4 Drawing Sheets

(51) Int. Cl.
*H04B 17/11* (2015.01)
*H03B 5/04* (2006.01)
*H04L 1/00* (2006.01)

(52) U.S. Cl.
CPC .......... *H04L 1/0007* (2013.01); *H04L 1/0026* (2013.01); *H04L 1/0061* (2013.01)

(58) Field of Classification Search
CPC ....... H04L 1/0026; H04L 1/0061; H04L 1/00; H04W 56/00
USPC ..................................................... 455/67.11
See application file for complete search history.

(56) References Cited

U.S. PATENT DOCUMENTS

2006/0088056 A1* 4/2006 Quigley ................ H04L 41/142
370/468
2012/0163504 A1* 6/2012 Nemeth .............. H04L 27/0014
375/319

* cited by examiner

SERVER DATA SENDING METHOD AND APPARATUS

CROSS-REFERENCE TO RELATED APPLICATION

The present disclosure claims the benefits of priority to International Application No. PCT/CN2019/089926, filed on Jun. 4, 2019, which claims priority to Chinese Patent Application No. 201810610156.X, filed on Jun. 13, 2018, both of which are incorporated herein by reference in their entireties.

BACKGROUND

Internet of Things technologies marks the third information technology revolution after computers and the Internet. With advantages of real-time performance and interactivity, and Internet of Things technologies have been widely used in urban management, digital homes, positioning and navigation, logistics management, security systems, and many other fields. Among the Internet of Things technologies, Long Range (LoRa) is an ultra-long-distance transmission scheme based on a spread spectrum technology. LoRa has characteristics such as long transmission distance, low power consumption, multiple nodes, and low cost.

A LoRa network includes a terminal, a base station, and a server. Operating modes of a LoRa terminal include: Class B mode. The terminal running in the Class B mode agrees with the server to open a receiving window in a predictable time window, and the server sends a downlink data frame to the terminal within the receiving window. When sending downlink data, the base station can first send a preamble. In the process of sending the preamble, if the receiving window of the terminal is opened and the preamble is received, the terminal can keep the receiving window open to receive subsequent valid data signals. If the terminal misses the preamble within the receiving window, the downlink data frame can be lost.

The terminal operates at different operating rates (e.g., at different data rates) according to network signal states. A higher operating rate indicates a higher transmission rate and lower sensitivity and a lower operating rate indicates a lower transmission rate and higher sensitivity.

There are problems in some conventional systems. In one example, when the operating rate of a terminal is relatively high and a preamble with a default length is adopted at the same time, window calibration between the terminal and the server can have a requirement of high precision. Besides, the local time of the terminal is calibrated by a crystal oscillator, and a time error of the crystal oscillator is unstable and inconsistent. If the terminal misses the preamble due to a crystal oscillator error when the receiving window is open, downlink data frames can be lost.

SUMMARY

Embodiments of the present disclosure provide a server data sending method and a server data sending apparatus. The method can include: acquiring, by a server, crystal oscillator error information and operating rate information of a terminal; setting, by the server, preamble length information according to the crystal oscillator error information and the operating rate information; and sending, by the server, a downlink data frame to the terminal, the downlink data frame comprising a preamble aligned with the preamble length information.

BRIEF DESCRIPTION OF THE DRAWINGS

The accompanying drawings described herein are used to provide further understanding of the present disclosure and constitute a part of the present disclosure. Exemplary embodiments of the present disclosure and descriptions of the exemplary embodiments are used to explain the present disclosure and are not intended to constitute inappropriate limitations to the present disclosure. In the accompanying drawings.

DETAILED DESCRIPTION

Figure 1:
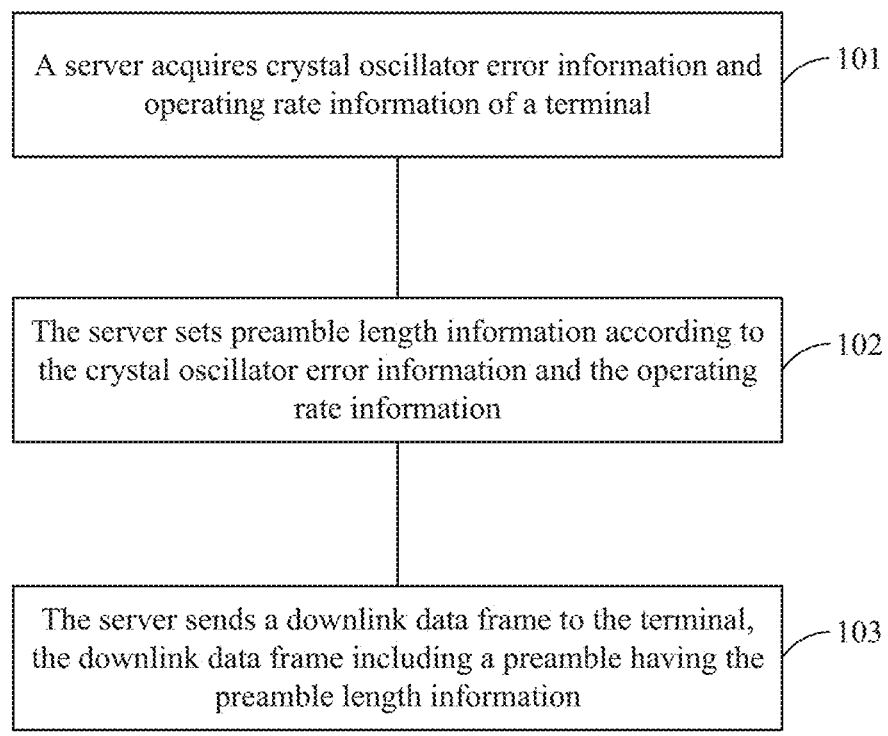
FIG. 1 is a flowchart of an exemplary server data sending method, consistent with some embodiments of the present disclosure.

To facilitate understanding of the solutions in the present disclosure, the technical solutions in some of the embodiments of the present disclosure will be described with reference to the accompanying drawings. It is appreciated that the described embodiments are merely a part of rather than all the embodiments of the present disclosure. Consistent with the present disclosure, other embodiments can be obtained without departing from the principles disclosed herein. Such embodiments shall also fall within the protection scope of the present disclosure.

A LoRa network includes a terminal, a base station (e.g., a gateway), and a server. The terminal has LoRa network connection capability and is connected to the LoRa network. According to different scenarios in which the LoRa network is deployed, the terminal can include different electronic devices. For example, when the LoRa network is applied to urban management, the terminal can include an intelligent electric meter. When the LoRa network is applied to digital homes, the terminal can include various intelligent household electrical appliances.

Operating modes of the terminal include: Class A mode, Class B mode, and Class C mode.

A terminal in the Class A mode uses an ALOHA protocol to report data on demand Each uplink can be followed by two short downlink receiving windows, so as to achieve two-way transmission. Such an operation is the most power-saving.

A terminal in the Class B mode allows more receiving windows. The terminal in the Class B mode can open a receiving window within a predictable time in addition to the receiving window after random uplink of the terminal in the Class A mode. The window is referred to as a pulse timeslot (e.g., Ping-slot). A downlink data frame sent by the server in the receiving window is referred to as a pulse frame (e.g., Ping frame). In order to enable the terminal to open the receiving window at a specified time, the terminal needs to receive a time-synchronized beacon frame from the base station. In this way, the server can also know timing of all receiving windows of a terminal device.

As described earlier, conventional systems with a terminal in the Class B mode can have some problems. Time error of crystal oscillator of the terminal can cause downlink data frame lost when the terminal receives downlink data frames within the open receiving window. Embodiments of the present disclosure provide solutions to address the problems. A server according to some embodiments can set preamble length information according to crystal oscillator error information and operating rate information of a terminal and send a downlink data frame including a preamble having the preamble length information to the terminal. In a case that a crystal oscillator error in the terminal cannot be changed, the terminal can detect the preamble in a longer time period by adjusting the length of the preamble, thereby improving a success rate of delivering the downlink data frame.

A terminal in the Class C mode keeps the receiving window always open, and only closes it briefly during sending. The terminal in the Class C mode can consume more power than the terminal in the Class A mode and the terminal in the Class B mode.

The base station, also referred to as a gateway or concentrator in the LoRa network, has a wireless connection convergence function, including providing access to the LoRa network for the terminal, forwarding data received from the server or the terminal, and achieving data interchange between the terminal and the server. The base station can also exchange data with other base stations within a signal coverage area of the base station by transferring wireless frames.

The server can include a server or a server cluster, and is configured to perform service processing according to data acquired from the base station or the terminal and to control an operating mode and an operating state of the base station or the terminal.

FIG. 1 is a flowchart of an exemplary server data sending method, consistent with some embodiments of the present disclosure. The method can include the following steps.

In step 101, a server acquires crystal oscillator error information and operating rate information of a terminal.

The local time of the terminal can be calibrated by a crystal oscillator. A time error of the crystal oscillator is unstable and is related to the temperature of an environment where the terminal is located.

The crystal oscillator error information can indicate the magnitude of a crystal oscillator error. A greater crystal oscillator error indicates a greater time error between the server and the terminal; and a smaller crystal oscillator error indicates a smaller time error between the server and the terminal.

In some embodiments, crystal oscillator error information of each terminal is pre-recorded. When the server needs to send a downlink data frame to a terminal, the server can search for crystal oscillator error information of the terminal from the pre-recorded crystal oscillator error information.

In some embodiments, the terminal runs in the Class B mode. The terminal needs to agree with the server on cycle information of opening a receiving window and operating rate information of the terminal.

The terminal can open a receiving window at a predictable time according to the agreed cycle information.

In some embodiments, the terminal can regularly report the operating rate information to the server, so that the server knows a current operating rate of the terminal. The terminal can operate at different operating rates according to network signal conditions. A higher operating rate indicates a higher transmission rate and lower sensitivity; and a lower operating rate indicates a lower transmission rate and higher sensitivity. The sensitivity refers to the capability of the terminal to demodulate a valid signal despite interference and noise. Under the same interference and noise conditions (such as transmission distance and penetration condition), the terminal at a higher operating rate has a higher probability of having a demodulation error. A higher operating rate indicates a shorter signal transmission distance and worse penetrability.

In some embodiments, the server can send a request to the terminal, and after receiving the request, the terminal reports current operating rate information to the server.

In some embodiments, the server can send expected operating rate information to the terminal, and the terminal sets its own operating rate information to the operating rate information expected by the server.

In step 102, the server sets preamble length information according to the crystal oscillator error information and the operating rate information.

A preamble is a regulated wireless signal to notify a wireless receiver that the subsequent wireless signal includes valid information. For example, in order to achieve "lock" to a subsequent LoRa signal, a long "constant chirp" preamble can be transmitted. After a current preamble is sent, valid data can be sent immediately. The preamble can be set as a variable number of "symbols," which are just the number of chirps. As implemented in a LoRaWAN protocol, the preamble can by default have a length of 8 symbols.

The length of the preamble is associated with a sending duration of the preamble. In a case that a crystal oscillator error in the terminal cannot be changed, the terminal can detect the preamble in a longer time period by adjusting the length of the preamble, thereby improving a success rate of delivering the downlink data frame.

In step 103, the server sends a downlink data frame to the terminal, the downlink data frame including a preamble having the preamble length information.

After setting the preamble length information, the server can add the preamble having the preamble length information to the downlink data frame, and then send the downlink data frame to the terminal.

In some embodiments, a server can set preamble length information according to crystal oscillator error information and operating rate information of a terminal, and send a downlink data frame including a preamble having the preamble length information to the terminal. In a case that a crystal oscillator error in the terminal cannot be changed, the terminal can detect the preamble in a longer time period by adjusting the length of the preamble, thereby improving a success rate of delivering the downlink data frame.

Figure 2:
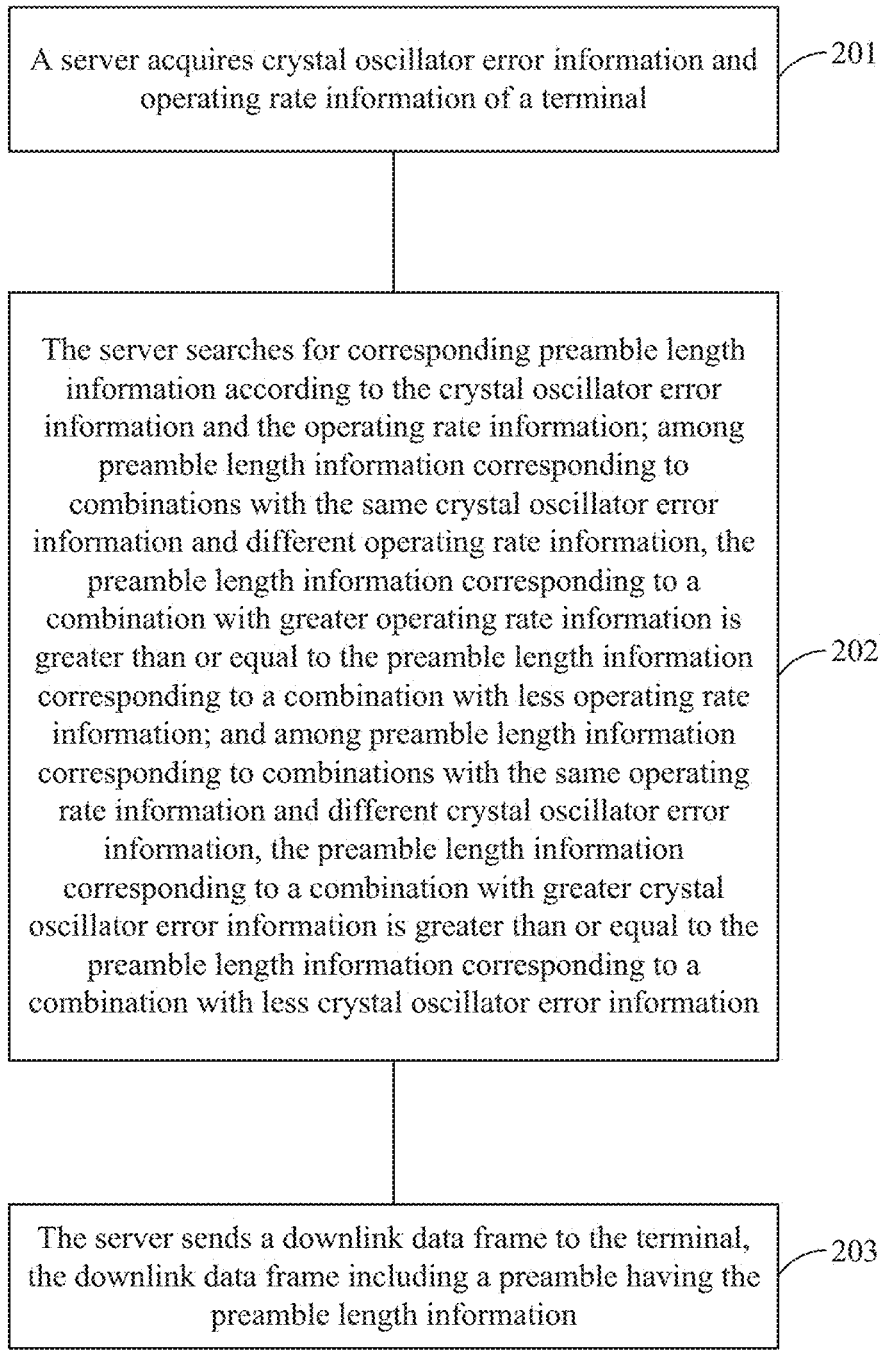
FIG. 2 is a flowchart of an exemplary server data sending method, consistent with some embodiments of the present disclosure.

FIG. 2 is a flowchart of an exemplary server data sending method, consistent with some embodiments of the present disclosure. The method can include the following steps.

In step 201, a server acquires crystal oscillator error information and operating rate information of a terminal.

In some embodiments, crystal oscillator error information of each terminal is pre-recorded. When the server needs to send a downlink data frame to a terminal, the server can search for crystal oscillator error information of the terminal from the pre-recorded crystal oscillator error information.

In some embodiments, the terminal runs in the Class B mode. The terminal needs to agree with the server on cycle information of opening a receiving window and operating rate information of the terminal.

The terminal can open a receiving window at a predictable time according to the agreed cycle information.

In some embodiments, the terminal can regularly report the operating rate information to the server, so that the server knows a current operating rate of the terminal.

In some embodiments, the server can send a request to the terminal, and after receiving the request, the terminal reports current operating rate information to the server.

In some embodiments, the server can send expected operating rate information to the terminal, and the terminal sets its own operating rate information to the operating rate information expected by the server.

In step 202, the server searches for corresponding preamble length information according to the crystal oscillator error information and the operating rate information. Among preamble length information corresponding to combinations with the same crystal oscillator error information and different operating rate information, the preamble length information corresponding to a combination with greater operating rate information is greater than or equal to the preamble length information corresponding to a combination with smaller operating rate information; and among preamble length information corresponding to combinations with the same operating rate information and different crystal oscillator error information, the preamble length information corresponding to a combination with greater crystal oscillator error information is greater than or equal to the preamble length information corresponding to a combination with smaller crystal oscillator error information.

In some embodiments, each piece of crystal oscillator error information and each piece of operating rate information constitute a combination, and each combination corresponds to a piece of preamble length information.

A plurality of combinations of crystal oscillator error information and operating rate information, as well as preamble length information corresponding to various combinations, can be preset in the server. After receiving current crystal oscillator error information and current operating rate information of the terminal, the server searches the preset information for preamble length information that matches a combination of the current crystal oscillator error information and the current operating rate information.

In preamble length information corresponding to combinations with the same crystal oscillator error information and different operating rate information, the preamble length information corresponding to a combination with greater operating rate information is greater than or equal to the preamble length information corresponding to a combination with smaller operating rate information.

For example, combination 1 and combination 2 have the same crystal oscillator error information, and the operating rate information of combination 1 is greater than the operating rate information of combination 2. Therefore, the preamble length information corresponding to combination 1 can be greater than or equal to the preamble length information corresponding to combination 2.

In preamble length information corresponding to combinations with the same operating rate information and different crystal oscillator error information, the preamble length information corresponding to a combination with greater crystal oscillator error information is greater than or equal to the preamble length information corresponding to a combination with smaller crystal oscillator error information.

For example, combination 3 and combination 4 have the same operating rate information, and the crystal oscillator error information of combination 3 is greater than the crystal oscillator error information of combination 4. Therefore, the preamble length information corresponding to combination 3 can be greater than or equal to the preamble length information corresponding to combination 4.

In some embodiments, the crystal oscillator error information can include crystal oscillator error level information, and the operating rate information can include operating rate level information.

The crystal oscillator error level information refers to information about classifications according to magnitudes of crystal oscillator errors.

In some embodiments, crystal oscillator errors in the terminal can be classified into 3 levels according to production standards and operating environments. If a crystal oscillator error is within 10 ppm (part per million), the crystal oscillator error is classified into crystal oscillator error level 1; if the crystal oscillator error is in a range of 10 ppm to 20 ppm, it is classified into crystal oscillator error level 2; if the crystal oscillator error is in a range of 20 ppm to 30 ppm, it is classified into crystal oscillator error level 3. When the crystal oscillator error is greater than 30 ppm, the server cannot control window alignment, so the server cannot send any downlink data frame to the terminal.

The operating rate level information refers to information about classifications according to magnitudes of operating rates. At present, LoRa terminals available in the market support 6 operating rate levels, which are operating rate level 0, operating rate level 1, operating rate level 2, operating rate level 3, operating rate level 4, and operating rate level 5, respectively.

Actual rates (unit: bit/sec) are as follows: operating rate level 0 is about 293 bit/sec; operating rate level 1 is about 537 bit/sec; operating rate level 2 is about 977 bit/sec; operating rate level 3 is about 1758 bit/sec; operating rate level 4 is about 3125 bit/sec; and operating rate level 5 is about 5469 bit/sec.

Step 202 can include: searching for, by the server, corresponding preamble length information according to the crystal oscillator error level information and the operating rate level information. Among preamble length information corresponding to combinations with the same crystal oscillator error level information and different operating rate level information, the preamble length information corresponding to a combination with greater operating rate level information being greater than or equal to the preamble length information corresponding to a combination with smaller operating rate level information. And among preamble length information corresponding to combinations with the same operating rate level information and different crystal oscillator error level information, the preamble length information corresponding to a combination with greater crystal oscillator error level information being greater than or equal to the preamble length information corresponding to a combination with smaller crystal oscillator error level information.

In some embodiments, each piece of crystal oscillator error level information and each piece of operating rate level information constitute a combination, and each combination corresponds to a piece of preamble length information. A plurality of combinations of crystal oscillator error level information and operating rate level information, as well as corresponding preamble length information, can be preset in the server.

In preamble length information corresponding to combinations with the same crystal oscillator error level information and different operating rate level information, the preamble length information corresponding to a combination with greater operating rate level information is greater than or equal to the preamble length information corresponding to a combination with smaller operating rate level information.

For example, combination 5 and combination 6 have the same crystal oscillator error level information, and the operating rate level information of combination 5 is greater than the operating rate level information of combination 6. Therefore, the preamble length information corresponding to combination 5 can be greater than or equal to the preamble length information corresponding to combination 6.

In preamble length information corresponding to combinations with the same operating rate level information and different crystal oscillator error level information, the preamble length information corresponding to a combination with greater crystal oscillator error level information is greater than or equal to the preamble length information corresponding to a combination with smaller crystal oscillator error level information.

For example, combination 7 and combination 8 have the same operating rate level information, and the crystal oscillator error level information of combination 7 is greater than the crystal oscillator error level information of combination 8. Therefore, the preamble length information corresponding to combination 7 can be greater than or equal to the preamble length information corresponding to combination 8.

Specifically, the preamble length information can be configured for combinations of the crystal oscillator error level information and the operating rate level information in the following manner.

For operating rate level 0 and crystal oscillator error level 1, the preamble length information can be set to default value 8, e.g., 8 symbols.

For operating rate level 0 and crystal oscillator error level 2, the preamble length information can be set to default value 8.

For operating rate level 0 and crystal oscillator error level 3, the preamble length information can be set to default value 8.

For operating rate level 1 and crystal oscillator error level 1, the preamble length information can be set to default value 8.

For operating rate level 1 and crystal oscillator error level 2, the preamble length information can be set to default value 8.

For operating rate level 1 and crystal oscillator error level 3, the preamble length information can be set to default value 8.

For operating rate level 2 and crystal oscillator error level 1, the preamble length information can be set to default value 8.

For operating rate level 2 and crystal oscillator error level 2, the preamble length information can be set to default value 8.

For operating rate level 2 and crystal oscillator error level 3, the preamble length information can be set to default value 8.

For operating rate level 3 and crystal oscillator error level 1, the preamble length information can be 12. In comparison, in the combination with the same crystal oscillator error level (level 1) but a smaller operating rate level (level 2), the preamble length information is set to be default value 8, which is smaller than 12.

For operating rate level 3 and crystal oscillator error level 2, the preamble length information can be 14.

For operating rate level 3 and crystal oscillator error level 3, the preamble length information can be 16.

For operating rate level 4 and crystal oscillator error level 1, the preamble length information can be 16.

For operating rate level 4 and crystal oscillator error level 2, the preamble length information can be 18.

For operating rate level 4 and crystal oscillator error level 3, the preamble length information can be 20.

For operating rate level 5 and crystal oscillator error level 1, the preamble length information can be 32.

For operating rate level 5 and crystal oscillator error level 2, the preamble length information can be 36.

For operating rate level 5 and crystal oscillator error level 3, the preamble length information can be 40.

In step 203, the server sends a downlink data frame to the terminal, the downlink data frame including a preamble having the preamble length information.

After setting the preamble length information, the server can add the preamble having the preamble length information to the downlink data frame, and then send the downlink data frame to the terminal. For example, when the preamble length information is set to be 12, the preamble having the preamble length information has a length of 12 symbols.

Step 203 can include the following sub-steps.

In sub-step S11, the server sends the downlink data frame to the terminal according to the crystal oscillator error information and the operating rate information when an agreed time window is reached.

The server can send the downlink data frame to the terminal according to the crystal oscillator error information and the operating rate information when a time window agreed with the terminal, that is, a receiving window opened by the terminal, is reached. When the receiving window is opened by the terminal, the receiving window starts and the server sends the downlink data frame at the start of the receiving window.

Further, sub-step S11 can include: sending, by the server, the downlink data frame to the terminal according to the crystal oscillator error level information and the operating rate level information when the agreed time window is reached.

When the operating rate level is 0, the operating rate level is 1, the operating rate level is 2, the operating rate level is 3, and the operating rate level is 4, no matter whether the crystal oscillator error in the terminal is at level 1, at level 2, or at level 3, the server can send the downlink data frame to the terminal when the agreed time window is reached, and the downlink data frame includes a preamble having preamble length information corresponding to the crystal oscillator error level information and the operating rate level information. The terminal can still receive the preamble when the agreed time window is opened.

Step 203 can include the following sub-steps.

In sub-step S12, the server sends the downlink data frame to the terminal according to the crystal oscillator error information and the operating rate information in advance by a preset time period before an agreed time window is reached.

The server can send the downlink data frame to the terminal according to the crystal oscillator error information and the operating rate information in advance by a preset time period before the time window agreed with the terminal is reached, that is, before the receiving window is opened by the terminal.

Further, sub-step S12 can include: sending, by the server, the downlink data frame to the terminal according to the crystal oscillator error level information and the operating rate level information in advance by a preset time period before the agreed time window is reached.

When the operating rate level of the terminal is 5, it can be difficult for the terminal to align with the agreed time window and receive the preamble within the agreed time window. Therefore, the server is required to send the downlink data frame to the terminal before the agreed time window is reached, and the downlink data frame includes a preamble having preamble length information corresponding to the crystal oscillator error level information and the operating rate level information. The entire time period for receiving the complete preamble is increased due to adding the preset time period to the length of the open receiving time window. Otherwise, the terminal cannot receive the preamble when the agreed time window is opened. Below are some examples that the preset time period is set with different lengths according to the combinations of different crystal oscillator error levels and the same operating rate level.

When the operating rate level is 5 and the crystal oscillator error level is 1, the server can send the downlink data frame to the terminal in advance by 16 ms before the agreed time window is reached.

When the operating rate level is 5 and the crystal oscillator error level is 2, the server can send the downlink data frame to the terminal in advance by 18 ms before the agreed time window is reached.

When the operating rate level is 5 and the crystal oscillator error level is 3, the server can send the downlink data frame to the terminal in advance by 20 ms before the agreed time window is reached.

In some embodiments, a server can set preamble length information according to crystal oscillator error information and operating rate information of a terminal, and send a downlink data frame including a preamble having the preamble length information to the terminal. In a case that a crystal oscillator error in the terminal cannot be changed, the terminal can detect the preamble in a longer time period by adjusting the length of the preamble, thereby improving a success rate of delivering the downlink data frame.

Figure 3:
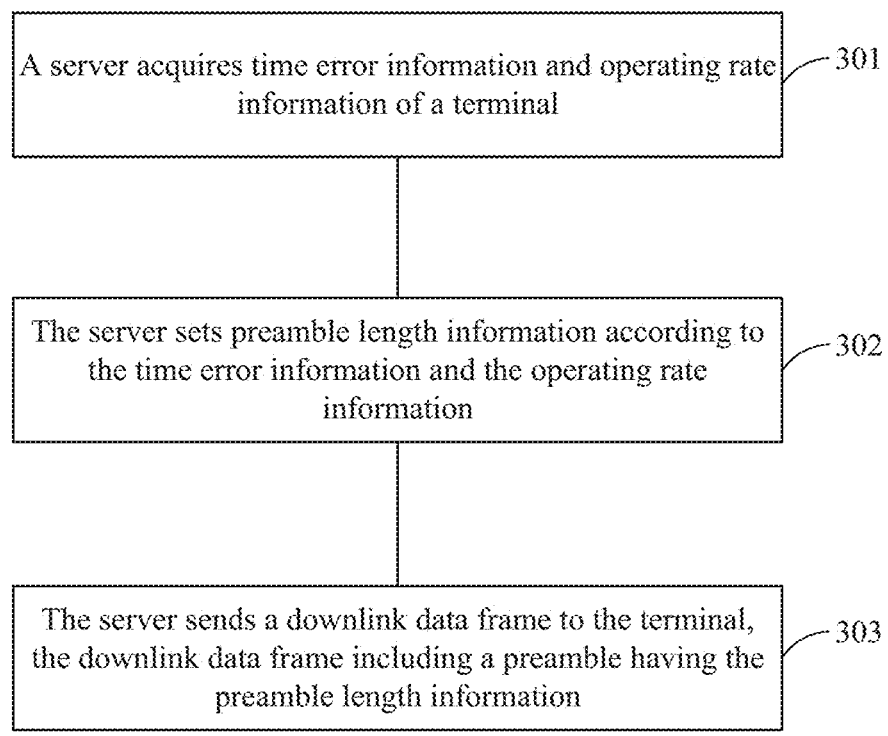
FIG. 3 is a flowchart of an exemplary server data sending method, consistent with some embodiments of the present disclosure.

FIG. 3 is a flowchart of an exemplary server data sending method, consistent with some embodiments of the present disclosure. The method can include the following steps.

In step 301, a server acquires time error information and operating rate information of a terminal. The time error information can indicate the magnitude of a time error between the server and the terminal. In particular, the time error information can be crystal oscillator error information, and the crystal oscillator error information can indicate the magnitude of a crystal oscillator error. The local time of the terminal is generally calibrated by a crystal oscillator. A greater crystal oscillator error indicates a greater time error between the server and the terminal; and a smaller crystal oscillator indicates a smaller time error between the server and the terminal.

In step 302, the server sets preamble length information according to the time error information and the operating rate information.

In step 303, the server sends a downlink data frame to the terminal, the downlink data frame including a preamble having the preamble length information. In some embodiments, a server can set preamble length information according to time error information and operating rate information of a terminal, and send a downlink data frame including a preamble having the preamble length information to the terminal. In a case that a crystal oscillator error in the terminal cannot be changed, the terminal can detect the preamble in a longer time period by adjusting the length of the preamble, thereby improving a success rate of delivering the downlink data frame.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

Figure 4:
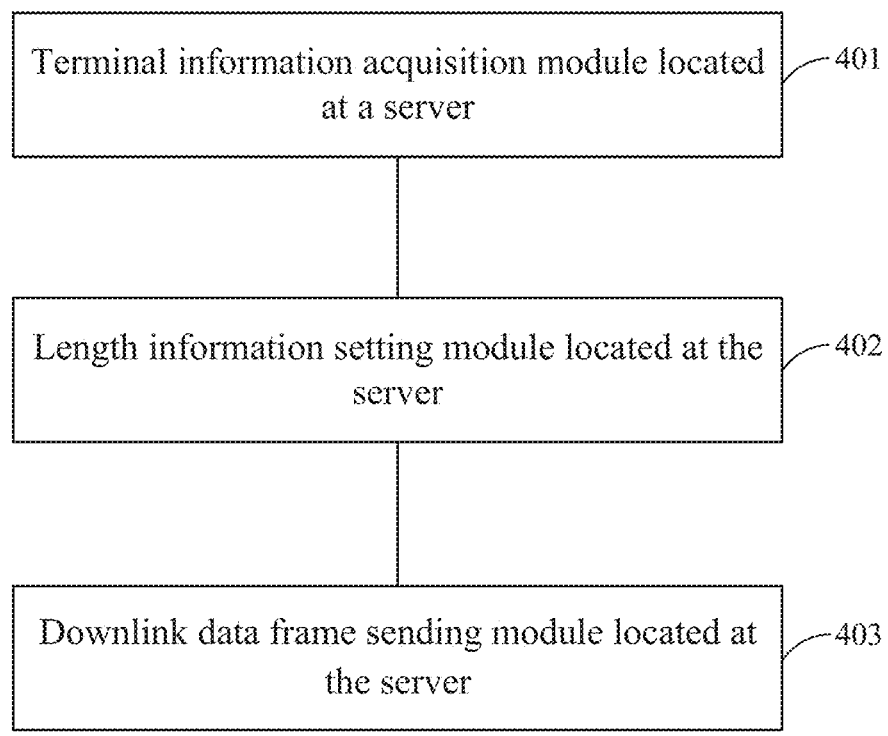
FIG. 4 is a schematic diagram of an exemplary server data sending apparatus, consistent with some embodiments of the present disclosure.

FIG. 4 is a schematic diagram of an exemplary server data sending apparatus, consistent with some embodiments of the present disclosure. The apparatus can include a terminal information acquisition module 401, a length information setting module 402, and a downlink data frame sending module 403.

Terminal information acquisition module 401 is located at a server and is configured to acquire crystal oscillator error information and operating rate information of a terminal.

Length information setting module 402 is located at the server and is configured to set preamble length information according to the crystal oscillator error information and the operating rate information.

Downlink data frame sending module 403 is located at the server and is configured to send a downlink data frame to the terminal, the downlink data frame including a preamble having the preamble length information.

In some embodiments, length information setting module 402 can include: a length information searching sub-module configured to search for corresponding preamble length information according to the crystal oscillator error information and the operating rate information; among preamble length information corresponding to combinations with the same crystal oscillator error information and different operating rate information, the preamble length information corresponding to a combination with greater operating rate information being greater than or equal to the preamble length information corresponding to a combination with smaller operating rate information; and among preamble length information corresponding to combinations with the same operating rate information and different crystal oscillator error information, the preamble length information corresponding to a combination with greater crystal oscillator error information being greater than or equal to the preamble length information corresponding to a combination with smaller crystal oscillator error information.

In some embodiments, the crystal oscillator error information includes crystal oscillator error level information, and the operating rate information includes operating rate level information.

The length information searching sub-module can include: a length information searching unit configured to search for corresponding preamble length information according to the crystal oscillator error level information and the operating rate level information; among preamble length information corresponding to combinations with the same crystal oscillator error level information and different operating rate level information, the preamble length information corresponding to a combination with greater operating rate level information being greater than or equal to the preamble length information corresponding to a combination with smaller operating rate level information; and among preamble length information corresponding to combinations with the same operating rate level information and different crystal oscillator error level information, the preamble length information corresponding to a combination with greater crystal oscillator error level information being greater than or equal to the preamble length information corresponding to a combination with smaller crystal oscillator error level information.

In some embodiments, downlink data frame sending module 403 can include: a first downlink data frame sending sub-module configured to send the downlink data frame to the terminal according to the crystal oscillator error information and the operating rate information when an agreed time window is reached.

In some embodiments, downlink data frame sending module 403 can include: a second downlink data frame sending sub-module configured to send the downlink data frame to the terminal according to the crystal oscillator error information and the operating rate information in advance by a preset time period before an agreed time window is reached.

In some embodiments, the first downlink data frame sending sub-module can include: a first downlink data frame sending unit configured to send the downlink data frame to the terminal according to the crystal oscillator error level information and the operating rate level information when the agreed time window is reached.

In some embodiments, the second downlink data frame sending sub-module can include: a second downlink data frame sending unit configured to send the downlink data frame to the terminal according to the crystal oscillator error level information and the operating rate level information in advance by a preset time period before the agreed time window is reached.

A server data sending apparatus provided by embodiments of the present disclosure can include a terminal information acquisition module, a length information setting module, and a downlink data frame sending module.

The terminal information acquisition module is located at a server and is configured to acquire time error information and operating rate information of a terminal.

The length information setting module is located at the server and is configured to set preamble length information according to the time error information and the operating rate information.

The downlink data frame sending module is located at the server and is configured to send a downlink data frame to the terminal, the downlink data frame including a preamble having the preamble length information.

An apparatus by embodiments of the present disclosure can include: one or more processors; and one or more machine-readable media having instructions stored thereon, the instructions, when executed by the one or more processors, causing the apparatus to perform the methods described in the embodiments of the present disclosure.

One or more machine-readable media having instructions stored thereon are also provided in embodiments of the present disclosure, and the instructions, when executed by one or more processors, causing the processor(s) to perform the methods described in the embodiments of the present disclosure.

As used herein, unless specifically stated otherwise, the term "or" encompasses all possible combinations, except where infeasible. For example, if it is stated that a device can include A or B, then, unless specifically stated otherwise or infeasible, the device can include A, or B, or A and B. As a second example, if it is stated that a device may include A, B, or C, then, unless specifically stated otherwise or infeasible, the device may include A, or B, or C, or A and B, or A and C, or B and C, or A and B and C.

Based on the several embodiments provided in the present disclosure, it should be appreciated that the disclosed technical contents may be implemented in another manner. The described apparatus, system, and method embodiments are only exemplary. For example, division of units or modules are merely exemplary division based on the logical functions. Division in another manner may exist in actual implementation. Further, a plurality of units or components may be combined or integrated into another system. Some features or components may be omitted or modified in some embodiments. In addition, the mutual coupling or direct coupling or communication connections displayed or discussed may be implemented by using some interfaces. The indirect coupling or communication connections between the units or modules may be implemented electrically or in another form.

It is appreciated that the above described embodiments can be implemented by hardware, or software (program codes), or a combination of hardware and software. If implemented by software, it may be stored in the above-described computer-readable media. The software, when executed by the processor can perform the disclosed methods. The computing units and other functional units described in this disclosure can be implemented by hardware, or software, or a combination of hardware and software. One of ordinary skill in the art will also understand that multiple ones of the above described modules/units may be combined as one module/unit, and each of the above described modules/units may be further divided into a plurality of sub-modules/sub-units.

In some embodiments, a non-transitory computer-readable storage medium including instructions is also provided, and the instructions may be executed by a device for performing the above-described methods. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same. The device may include one or more processors (CPUs), an input/output interface, a network interface, or a memory.

These computer program instructions can also be loaded onto a computer or another programmable data processing terminal device, so that a series of operation steps are performed on the computer or another programmable terminal device to produce computer-implemented processing, so that the instructions executed on the computer or another programmable terminal device provide steps for implementing the functions specified in one or more flows of the flowcharts and/or one or more blocks of the block diagrams.

It is appreciated that the above descriptions are only exemplary embodiments provided in the present disclosure. Consistent with the present disclosure, those of ordinary skill in the art may incorporate variations and modifications in actual implementation, without departing from the principles of the present disclosure. Such variations and modifications shall all fall within the protection scope of the present disclosure.

It is appreciated that terms "first," "second," and so on used in the specification, claims, and the drawings of the present disclosure are used to distinguish similar objects.

These terms do not necessarily describe a particular order or sequence. The objects described using these terms can be interchanged in appropriate circumstances. That is, the procedures described in the exemplary embodiments of the present disclosure could be implemented in an order other than those shown or described herein. In addition, terms such as "comprise," "include," and "have" as well as their variations are intended to cover non-exclusive inclusion. For example, a process, method, system, product, or device including a series of steps or units are not necessarily limited to the steps or units clearly listed. In some embodiments, they may include other steps or units that are not clearly listed or inherent to the process, method, product, or device.

What is claimed is:

1. A server data sending method, comprising:
   acquiring, by a server, crystal oscillator error information and operating rate information of a terminal;
   setting, by the server, preamble length information according to the crystal oscillator error information and the operating rate information; and
   sending, by the server, a downlink data frame to the terminal, the downlink data frame comprising a preamble having the preamble length information.

2. The method of claim 1, wherein setting, by the server, the preamble length information according to the crystal oscillator error information and the operating rate information comprises:
   searching for, by the server, corresponding preamble length information that matches a combination of the crystal oscillator error information and the operating rate information, each combination comprising crystal oscillator error level information and operating rate level information, wherein
   among preamble length information corresponding to combinations with same crystal oscillator error information and different operating rate information, the preamble length information corresponding to a combination with greater operating rate information is greater than or equal to the preamble length information corresponding to a combination with smaller operating rate information, and
   among preamble length information corresponding to combinations with same operating rate information and different crystal oscillator error information, the preamble length information corresponding to a combination with greater crystal oscillator error information is greater than or equal to the preamble length information corresponding to a combination with smaller crystal oscillator error information.

3. The method of claim 2, wherein the crystal oscillator error information comprises crystal oscillator error level information, and the operating rate information comprises operating rate level information, and searching for, by the server, the corresponding preamble length information according to the crystal oscillator error information and the operating rate information comprises:
   searching for, by the server, corresponding preamble length information that matches a combination of the crystal oscillator error level information and the operating rate level information, each combination comprising crystal oscillator error level information and operating rate level information, wherein
   among preamble length information corresponding to combinations with same crystal oscillator error level information and different operating rate level information, the preamble length information corresponding to a combination with greater operating rate level information is greater than or equal to the preamble length information corresponding to a combination with smaller operating rate level information, and
   among preamble length information corresponding to combinations with same operating rate level information and different crystal oscillator error level information, the preamble length information corresponding to a combination with greater crystal oscillator error level information is greater than or equal to the preamble length information corresponding to a combination with smaller crystal oscillator error level information.

4. The method of claim 3, wherein sending, by the server, the downlink data frame to the terminal comprises:
   sending, by the server, the downlink data frame to the terminal according to the crystal oscillator error information and the operating rate information in response to a start of an agreed time window having been reached, the agreed time window being agreed on by the server and the terminal.

5. The method of claim 4, wherein sending, by the server, the downlink data frame to the terminal according to the crystal oscillator error information and the operating rate information in response to the start of the agreed time window having been reached comprises:
   sending, by the server, the downlink data frame to the terminal according to the crystal oscillator error level information and the operating rate level information in response to the start of the agreed time window having been reached.

6. The method of claim 3, wherein sending, by the server, the downlink data frame to the terminal comprises:
   sending, by the server, the downlink data frame to the terminal according to the crystal oscillator error information and the operating rate information in response to a start of a preset time period before an agreed time window having been reached, the agreed time window being agreed on by the server and the terminal.

7. The method of claim 6, wherein sending, by the server, the downlink data frame to the terminal according to the crystal oscillator error information and the operating rate information in response to the start of the preset time period before the agreed time window having been reached comprises:
   sending, by the server, the downlink data frame to the terminal according to the crystal oscillator error level information and the operating rate level information in response to the start of the preset time period before the agreed time window having been reached.

8. A server data sending apparatus, comprising:
   a memory storing a set of instructions; and
   one or more processors configured to execute the set of instructions to cause the apparatus to perform:
   acquiring crystal oscillator error information and operating rate information of a terminal;
   setting preamble length information according to the crystal oscillator error information and the operating rate information; and
   sending a downlink data frame to the terminal, the downlink data frame comprising a preamble having the preamble length information.

9. The apparatus of claim 8, wherein setting the preamble length information according to the crystal oscillator error information and the operating rate information comprises:
   searching for corresponding preamble length information that matches a combination of the crystal oscillator error information and the operating rate information, each combination comprising crystal oscillator error level information and operating rate level information, wherein among preamble length information corresponding to combinations with same crystal oscillator error information and different operating rate information, the preamble length information corresponding to a combination with greater operating rate information is greater than or equal to the preamble length information corresponding to a combination with smaller operating rate information, and among preamble length information corresponding to combinations with same operating rate information and different crystal oscillator error information, the preamble length information corresponding to a combination with greater crystal oscillator error information is greater than or equal to the preamble length information corresponding to a combination with smaller crystal oscillator error information.

10. The apparatus of claim 9, wherein the crystal oscillator error information comprises crystal oscillator error level information, and the operating rate information comprises operating rate level information; and searching for the corresponding preamble length information according to the crystal oscillator error information and the operating rate information comprises:

searching for corresponding preamble length information that matches a combination of the crystal oscillator error level information and the operating rate level information, each combination comprising crystal oscillator error level information and operating rate level information, wherein among preamble length information corresponding to combinations with same crystal oscillator error level information and different operating rate level information, the preamble length information corresponding to a combination with greater operating rate level information is greater than or equal to the preamble length information corresponding to a combination with smaller operating rate level information, and among preamble length information corresponding to combinations with same operating rate level information and different crystal oscillator error level information, the preamble length information corresponding to a combination with greater crystal oscillator error level information is greater than or equal to the preamble length information corresponding to a combination with smaller crystal oscillator error level information.

11. The apparatus of claim 10, wherein sending the downlink data frame to the terminal comprises:

sending the downlink data frame to the terminal according to the crystal oscillator error information and the operating rate information in response to a start of an agreed time window having been reached, the agreed time window being agreed on by the server and the terminal.

12. The apparatus of claim 11, wherein sending the downlink data frame to the terminal according to the crystal oscillator error information and the operating rate information in response to the start of the agreed time window having been reached comprises:

sending the downlink data frame to the terminal according to the crystal oscillator error level information and the operating rate level information in response to the start of the agreed time window having been reached.

13. The apparatus of claim 10, wherein sending the downlink data frame to the terminal comprises:

sending the downlink data frame to the terminal according to the crystal oscillator error information and the operating rate information in response to a start of a preset time period before an agreed time window having been reached, the agreed time window being agreed on by the server and the terminal.

14. A non-transitory computer readable medium that stores a set of instructions that is executable by at least one processor of a server to cause the server to perform a server data sending method, the method comprising:

acquiring crystal oscillator error information and operating rate information of a terminal;

setting preamble length information according to the crystal oscillator error information and the operating rate information; and sending a downlink data frame to the terminal, the downlink data frame comprising a preamble having the preamble length information.

15. The non-transitory computer readable medium of claim 14, wherein setting the preamble length information according to the crystal oscillator error information and the operating rate information comprises:

searching for corresponding preamble length information that matches a combination of the crystal oscillator error information and the operating rate information, each combination comprising crystal oscillator error level information and operating rate level information, wherein among preamble length information corresponding to combinations with same crystal oscillator error information and different operating rate information, the preamble length information corresponding to a combination with greater operating rate information is greater than or equal to the preamble length information corresponding to a combination with smaller operating rate information, and among preamble length information corresponding to combinations with same operating rate information and different crystal oscillator error information, the preamble length information corresponding to a combination with greater crystal oscillator error information is greater than or equal to the preamble length information corresponding to a combination with smaller crystal oscillator error information.

16. The non-transitory computer readable medium of claim 15, wherein the crystal oscillator error information comprises crystal oscillator error level information, and the operating rate information comprises operating rate level information; and searching for the corresponding preamble length information according to the crystal oscillator error information and the operating rate information comprises:

searching for corresponding preamble length information that matches a combination of the crystal oscillator error level information and the operating rate level information, each combination comprising crystal oscillator error level information and operating rate level information, wherein among preamble length information corresponding to combinations with same crystal oscillator error level information and different operating rate level information, the preamble length information corresponding to a combination with greater operating rate level information is greater than or equal to the preamble length information corresponding to a combination with smaller operating rate level information, and among preamble length information corresponding to combinations with same operating rate level information and different crystal oscillator error level information, the preamble length information corresponding to a combination with greater crystal oscillator error level information is greater than or equal to the preamble length information corresponding to a combination with smaller crystal oscillator error level information.

17. The non-transitory computer readable medium of claim 16, wherein sending the downlink data frame to the terminal comprises:
sending the downlink data frame to the terminal according to the crystal oscillator error information and the operating rate information in response to a start of an agreed time window having been reached, the agreed time window being agreed on by the server and the terminal.

18. The non-transitory computer readable medium of claim 17, wherein sending the downlink data frame to the terminal according to the crystal oscillator error information and the operating rate information in response to the start of the agreed time window having been reached comprises:
sending the downlink data frame to the terminal according to the crystal oscillator error level information and the operating rate level information in response to the start of the agreed time window having been reached.

19. The non-transitory computer readable medium of claim 16, wherein sending the downlink data frame to the terminal comprises:
sending the downlink data frame to the terminal according to the crystal oscillator error information and the operating rate information in response to a start of a preset time period before an agreed time window having been reached, the agreed time window being agreed on by the server and the terminal.

20. The non-transitory computer readable medium of claim 19, wherein sending the downlink data frame to the terminal according to the crystal oscillator error information and the operating rate information in response to the start of the preset time period before the agreed time window having been reached comprises:
sending the downlink data frame to the terminal according to the crystal oscillator error level information and the operating rate level information in response to the start of the preset time period before the agreed time window having been reached.

* * * * *